United States Patent [19]
Fürter

[11] Patent Number: 5,742,436
[45] Date of Patent: Apr. 21, 1998

[54] MAXIMUM APERTURE CATADIOPTRIC REDUCTION OBJECTIVE FOR MICROLITHOGRAPHY

[75] Inventor: Gerd Fürter, Ellwangen, Germany

[73] Assignee: Carl-Zeiss-Stiftung, Heidenheim, Germany

[21] Appl. No.: 583,025

[22] PCT Filed: May 5, 1995

[86] PCT No.: PCT/EP95/01719

§ 371 Date: Jan. 19, 1996

§ 102(e) Date: Jan. 19, 1996

[87] PCT Pub. No.: WO95/32446

PCT Pub. Date: Nov. 30, 1995

[30] Foreign Application Priority Data

May 19, 1994 [DE] Germany .................. 44 17 489.6

[51] Int. Cl.[6] .................. G02B 17/00; G02B 27/14; G02B 13/22; G02B 9/00
[52] U.S. Cl. .................. 359/727; 359/631; 359/663; 359/732; 359/739
[58] Field of Search .................. 359/727, 732, 359/739, 663, 729–730, 631, 633

[56] References Cited

U.S. PATENT DOCUMENTS

| | | | |
|---|---|---|---|
| 4,953,960 | 9/1990 | Williamson | 359/663 |
| 5,052,763 | 10/1991 | Singh et al. | 359/355 |
| 5,212,593 | 5/1993 | Williamson et al. | 359/727 |
| 5,289,312 | 2/1994 | Hashimoto et al. | 359/727 |
| 5,402,267 | 3/1995 | Fürter et al. | 359/727 |

FOREIGN PATENT DOCUMENTS

| | | |
|---|---|---|
| 0341385 | 11/1989 | European Pat. Off. |
| 4110296 | 10/1991 | Germany . |

*Primary Examiner*—David C. Nelms
*Assistant Examiner*—Jordan M. Schwartz
*Attorney, Agent, or Firm*—Walter Ottesen

[57] ABSTRACT

A catadioptric reduction objective has a concave mirror 19', a beam splitter 150' and several lens groups (100', 200'; 300', 400'). The system diaphragm 40' is mounted between beam splitter surface 15' and image plane 36' and especially within the last lens group 400'. NA=0.7; for UV, DUV; image side or both sides telecentric; also achromatized.

35 Claims, 4 Drawing Sheets

5,742,436

MAXIMUM APERTURE CATADIOPTRIC REDUCTION OBJECTIVE FOR MICROLITHOGRAPHY

FIELD OF THE INVENTION

The invention relates to a catadioptric reduction objective having a concave mirror, a beam splitting surface and several lens groups.

BACKGROUND OF THE INVENTION

For an objective of this kind in accordance with U.S. Pat. No. 5,402,267, the system diaphragm is arranged at: the location of the concave mirror, on the input and output surface of the beam splitter facing the concave mirror or in the space between the concave mirror and the beam splitter. The same applies to EP 0.341.385; EP 0.350,955; EP 0.465, 882; and, EP 0.554,994. In such arrangements, the highest attainable numerical aperture for usable image quality is 0.60.

In the arrangement of the same class according to DE 4,110,296, the diaphragm is mounted on the beam splitting surface of the beam splitter. The beam splitter is used in transmission on the reticle side and is used in reflection on the wafer side. The consequences are: the diaphragm is no longer variable; and, the elliptically formed diaphragm is positioned greatly inclined (approximately 45°) to the optical axis. Different image heights with varying main ray angles at the diaphragm utilize diaphragm apertures which are of different size which leads to contrast variations, telecentric variations and intensity variations.

A catadioptric reduction projection objective is known from U.S. Pat. No. 5,289,312. This catadioptric reduction projection objective has: a first lens group; a partially transmitting mirror (disposed so as to be inclined) on a plane-parallel plate or in a beam splitter; a concave mirror; a scattering second lens group between the two mirrors; a third lens group having a positive refractive index at the end of the light path for image generation; and, a diaphragm between the partially transmitting mirror and the third lens group.

The embodiment having the beam splitter is given only in claim 11 and is otherwise not described. The numerical aperture of the single example is only 0.45. Quartz and fluorite are alternately combined for achromatization. The partially transmitting mirror is used first in reflection and thereafter in transmission.

A beam splitter in the sense of this application has a beam splitter surface arranged between two prisms like a beam splitter cube. The beam splitter surface is therefore a partially transmitting mirror.

SUMMARY OF THE INVENTION

The object of the invention is to realize a catadioptric reduction objective having a possible numerical aperture of significantly greater than 0.60 wherein the system diaphragm is intended to lie rearward of the beam splitter surface.

Preferably, the main ray and peripheral ray angles at the beam splitter should be sufficiently small in order to make possible a polarization beam splitter. Furthermore, the objective should preferably be telecentric at the image side. In addition, the beam splitter should be as small as possible under these conditions.

Such an objective is used for microlithographic projection with image end structures in the submicron range and is built into a microlithographic projection apparatus for this purpose.

BRIEF DESCRIPTION OF THE DRAWINGS

The invention will now be described with reference to the drawings wherein.

DESCRIPTION OF THE PREFERRED EMBODIMENTS OF THE INVENTION

Figure 1A:
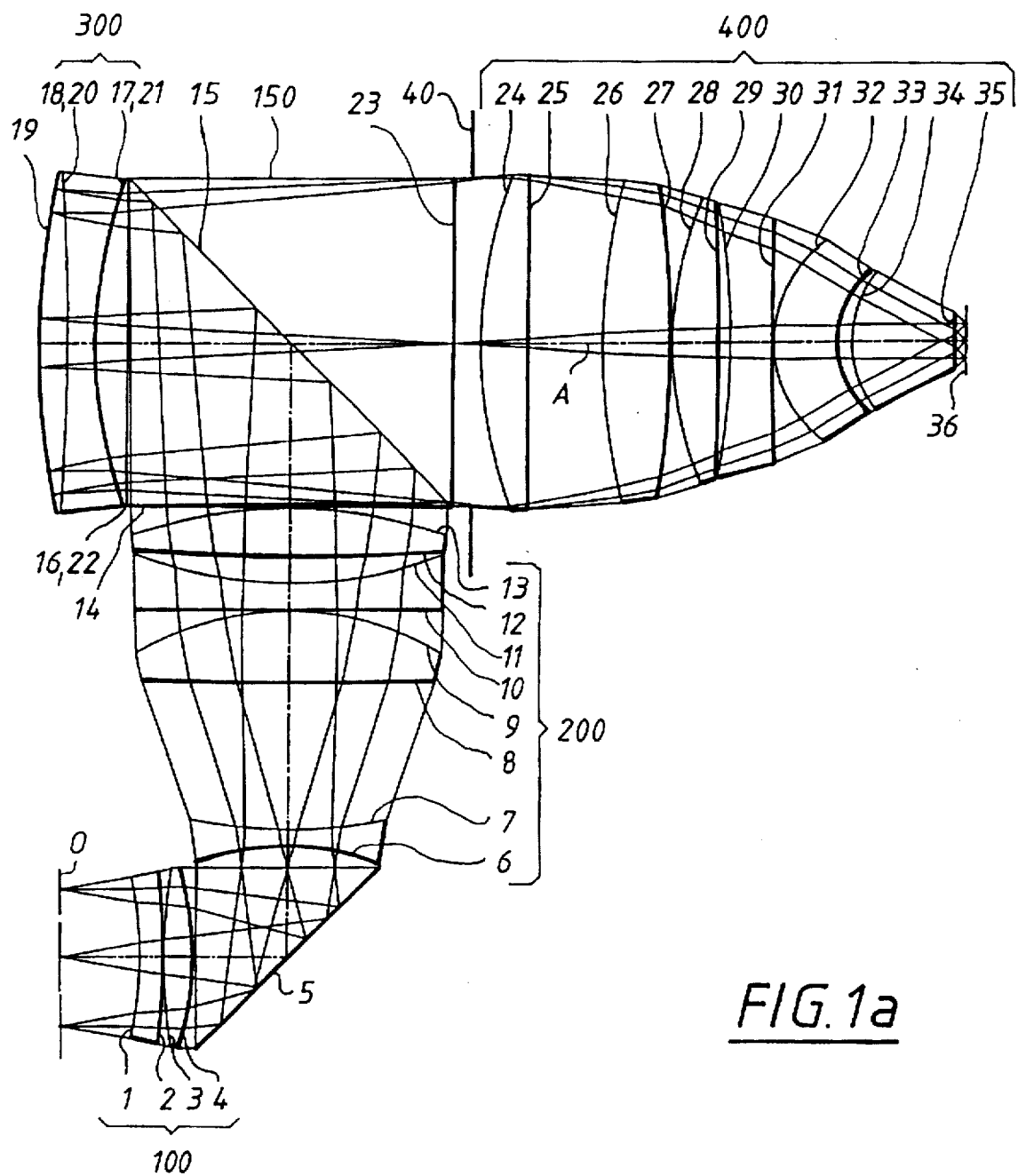
FIG. 1a is a lens section of a catadioptric reduction objective.

FIG. 1a is an example of a 4:1 reduction objective according to the invention for microlithography with the three lens groups (100, 200, 300, 400, the beam splitter surface 15 in the beam splitter 150 and with the concave mirror 19. The object plane (for the reticle) lies at 0, the image plane for the wafer is at 36. A deflection mirror 5 between the first part 100 and second part 200 of the first lens group serves conventionally to provide a more compact assembly and permits parallel positioning of reticle and wafer. However, the deflection and the subdivision of the first lens group (100, 200) are not necessary. Table 1 lists the radii and distances of all optically effective surfaces 1 to 35. The type of glass is quartz throughout. The beam splitter surface 15 is arranged diagonally in the beam splitter cube 150 with the boundary surfaces 14 (entry), 16 at the exit mirror side and 22 at the entry mirror side, and 23 (exit image side).

The distance from the beam splitter 150 (that is, from the object side plane which is perpendicular to the optical axis and which touches the periphery of the light bundle on the beam splitter plate at one point) to the object plane 0 is less than the focal length of the first lens group (100, 200) disposed therebetween.

This embodiment is configured for the wavelength 248.38 nm. The example is telecentric at both sides with main ray angles less than 0.2°. The clear working distance is 40 mm (0–1) at the reticle end and 6 mm (35–36) at the wafer end.

The numerical aperture achieved is NA=0.70 for an image circle diameter of 20 mm.

The system diaphragm 40 fixes the aperture and is at the wafer side 17 mm from beam splitter 150 (exit surface 23). The system diaphragm 40 has to be moved in the direction of beam splitter 150 (exit surface 23) when stopping down if stopping down is desired and the telecentricity in the wafer space (object plane 36) is to be precisely maintained. The limit value for the closed diaphragm would be the exit surface 23 of the beam splitter 150.

This displacement of the system diaphragm 40 when stopping down is required because the system part forward thereof is greatly overcorrected with respect to the Petzval sum. This overcorrection is only partially compensated by negative spherical pupillary aberration.

The system diaphragm 40 can be embodied as a special component or an adjustable component or can be a lens frame or a tube.

In this embodiment, the beam splitter surface 15 is first used in reflection and then in transmission.

Figure 1B:
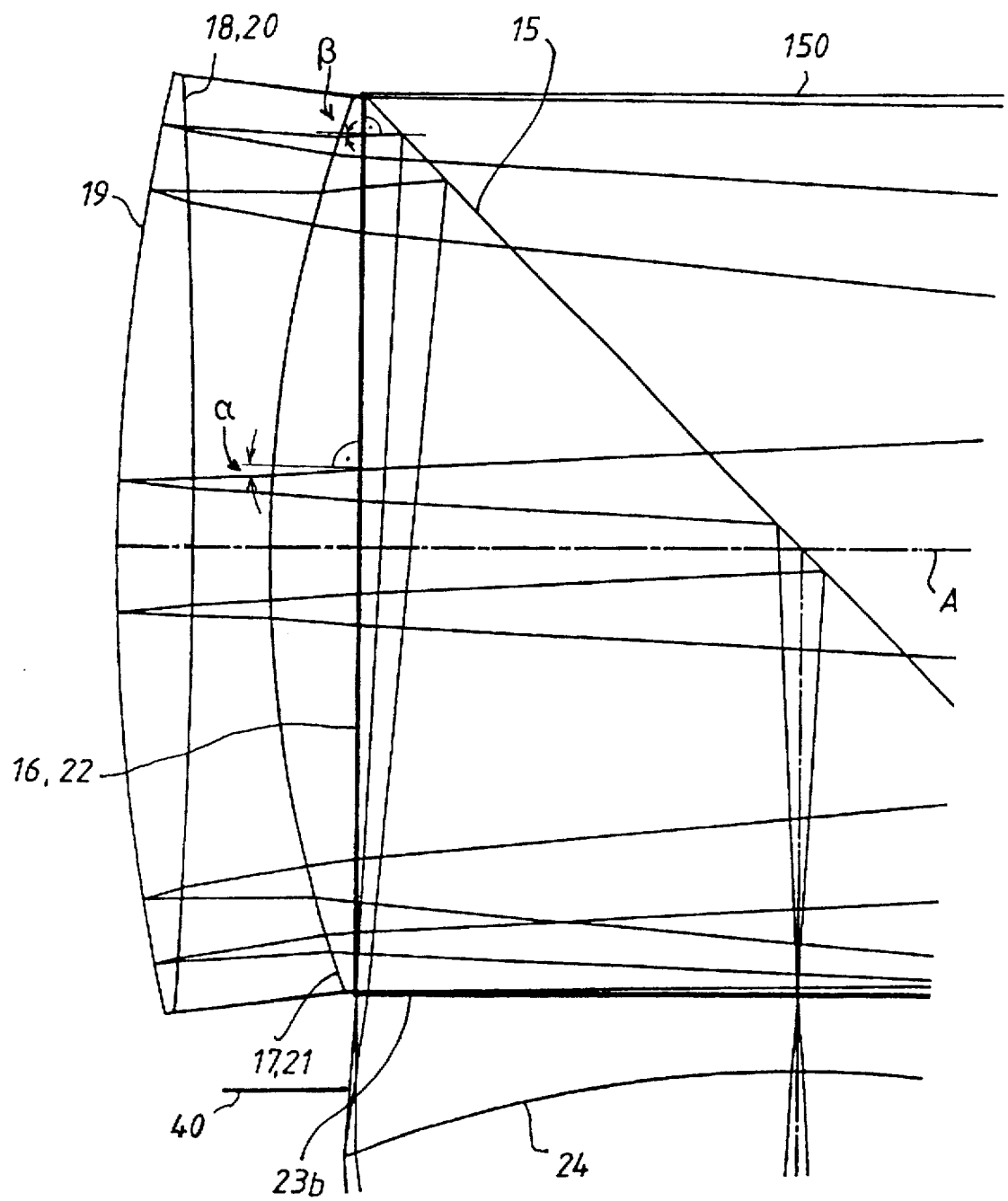
FIG. 1b is an enlarged detail of FIG. 1a but with an exchanged sequence of reflection and transmission at the beam splitter.

FIG. 1b shows a detail of FIG. 1a in the region of the concave mirror 19 and of the beam splitter 150, however, with a reversed sequence of transmission and reflection at the beam splitter surface 15. The position of the first lens group (100, 200) and the third lens group 400 (having the lens surface 24) including the system diaphragm 40 is therefore reflected at the beam splitter surface 15. The exit surface 23b of beam splitter 150 then replaces the entry surface 14 of FIG. 1a. With this measure, the concave mirror 19 does not project into the reticle plane which affords more freedom for the holding and displacing devices to be provided there.

FIG. 1b shows that the main ray angles α and the peripheral ray angles β lie below 5° at the beam splitter cube 150 in air. The peripheral ray angle β is even below 4° at the image side exit. In the embodiment described, the peripheral ray angle β is deliberately held divergent and in the order of magnitude of the main ray angle α. The greater the main ray heights in the beam splitter 150, the lesser are the peripheral ray heights and therefore the cross sections of the ray bundles. In this way, the penetrating heights of the outermost coma rays are held approximately constant in the beam splitter cube 150.

The ray heights in the beam splitter 150 are therefore nowhere greater than at the image side exit 23 or 23b close to the location of the system diaphragm 40.

However there, the ray heights and the diaphragm diameter are essentially determined by the pregiven light-conductance value 0.70×20=14 and the selected main ray angle of just 4.5°. The diameter of the diaphragm 40 and the edge length of the 45° beam splitter cube 150 are approximately 190 mm.

If the polarization beam splitter surface 15 requires better collimated light for technical reasons in reflection or transmission, then this can be considered in the design but is at the expense of the diameters.

The λ/4-layer required in connection with a polarization splitter surface 15 can be applied to one of the surfaces 16 to 19 or can be inserted between the above-mentioned surfaces as a foil or a plane-parallel plate.

In lieu of the beam splitter cube 150, a beam splitter plate having a partially transmitting mirror can likewise be used (see U.S. Pat. No. 5,289,312). This beam splitter plate is inclined at an angle of approximately 35° to 60°. Light which is collimated as much as possible is required for the transmission in this embodiment. This is more easily attainable when the collimated light is first transmitted and then reflected.

The present design has an intensely diverging lens 300 between beam splitter surface 15 and concave mirror 19. Only in this way can light having small peripheral ray angles be conducted through the beam splitter cube 150 without the refractive power of the mirror 19 being too greatly reduced. The refractive power is necessary for an adequate corrective effect.

In contrast to the above described previously known objective configurations (even to DE 4,110,296), the objective part (third lens group 400) is built up at the wafer end so as to be very long. Especially significant is the large air space between the surfaces 25 and 26.

For telecentricity at the image side (wafer side), the forward principal point of this lens group 400 is disposed rearward of the diaphragm 40 by an amount corresponding to the focal length. The focal length is 128 mm for an image height of 10 mm and the principal ray angle of just 4.5°. The forward main point therefore is approximately 128 mm away from the exit surface 23 of the beam splitter 150. The distance from beam splitter 150 to the image 36 (wafer) is even significantly greater than twice the focal length. In this embodiment, the multiple is 2.2 (in U.S. Pat. No. 5,289,312, this distance is approximately 1.8 times the focal length and in DE 4,110,296, the distance is 1.5 times the focal length and for all other cited applications, it is still less). If a beam splitter plate is substituted for the beam splitter, then the distance to the surface, which is equivalent to the exit surface of the beam splitter, is to be used in lieu of the distance to the beam splitter. This surface is perpendicular to the optical axis and intersects the partially-transmitting mirror in a point in common with the periphery of the light bundle. This measure supports the arrangement of the system diaphragm 40 outside of the beam splitter 150.

The distance from the beam splitter 150 (that is, the image side plane which is perpendicular to the optical axis and which touches the periphery of the light bundle on the beam splitter plate in one point) to the image plane 36 is greater than 1.9 times the focal length of the third lens group 400 disposed between the beam splitter surface 15 and the image plane 36.

Further, this third lens group 400 comprises intensely converging subgroups (24, 25), (26, 27), (28 to 31), (32 to 35). A scattering air space for correcting spherical aberration and coma of higher order is provided between the surfaces 29 and 30 and, to correct for distortions and astigmatism of higher order, a scattering air space is provided between the surfaces 33 and 34.

The object side objective part comprises a first lens group having two parts: a converging part 100 and a second part 200. The part 100 comprises two lenses (1, 2), (3, 4) which, inter alia, take care of telecentricity. The second part 200 comprises the scattering lens (6, 7) and the converging subgroup having the surfaces 8 to 13 with a corrective scattering air gap between the surfaces 11 and 12.

A deflecting mirror 5 between the first part 100 and the second part 200 is optional and is usually provided in order to obtain a compact arrangement having parallel positions of the reticle (object plane 0) and the wafer (image plane 36).

In contrast to the previously known configurations of the objective, this objective part at the object side is very short, that is, the first lens group (100, 200).

The focal length of this first lens group (100, 200) is close to 4 times the focal length of the lens group 400 disposed at the wafer end (of the diaphragm 40), and is 556 mm. This is so because of the imaging scale of the entire objective of 4:1 and because of the low refractive index combination of lens 300 and concave mirror 19. The focal length of this objective part is therefore relatively small in comparison to the focal intercept for the telecentric main ray, namely, the distance of the lens (12, 13) to the system diaphragm 40. In order to attain this, the intensely diverging refractive power of the lens (6, 7) together with the intensely converging refractive power of the subgroup (8 to 13) operates as a retrofocus configuration. Looking back from the beam splitter 150, this configuration functions as a tele-configuration having a correspondingly short focal intercept. Correspondingly, the structural length of this first lens group (100, 200) (approximately 400 mm) is significantly less than its focal length.

The monochromatic imaging quality of this optic corresponds to the requirements of microlithography.

The power-limiting chromatic aberration (the chromatic longitudinal aberration) is less than half as great as for conventional pure lens objectives of the same specification. This image error can be halved once again when the four converging lenses (subgroups (24, 25), (26, 27), (28 to 31), (32 to 35)) rearward of the system aperture 40 are made of fluorite in lieu of quartz. The achromatization can be still further improved by introducing dissolved quartz-fluorite composite members, however, with greatly increased constructional complexity.

The invention therefore includes also achromatized objectives and can also be used at other wavelengths.

Figure 2:
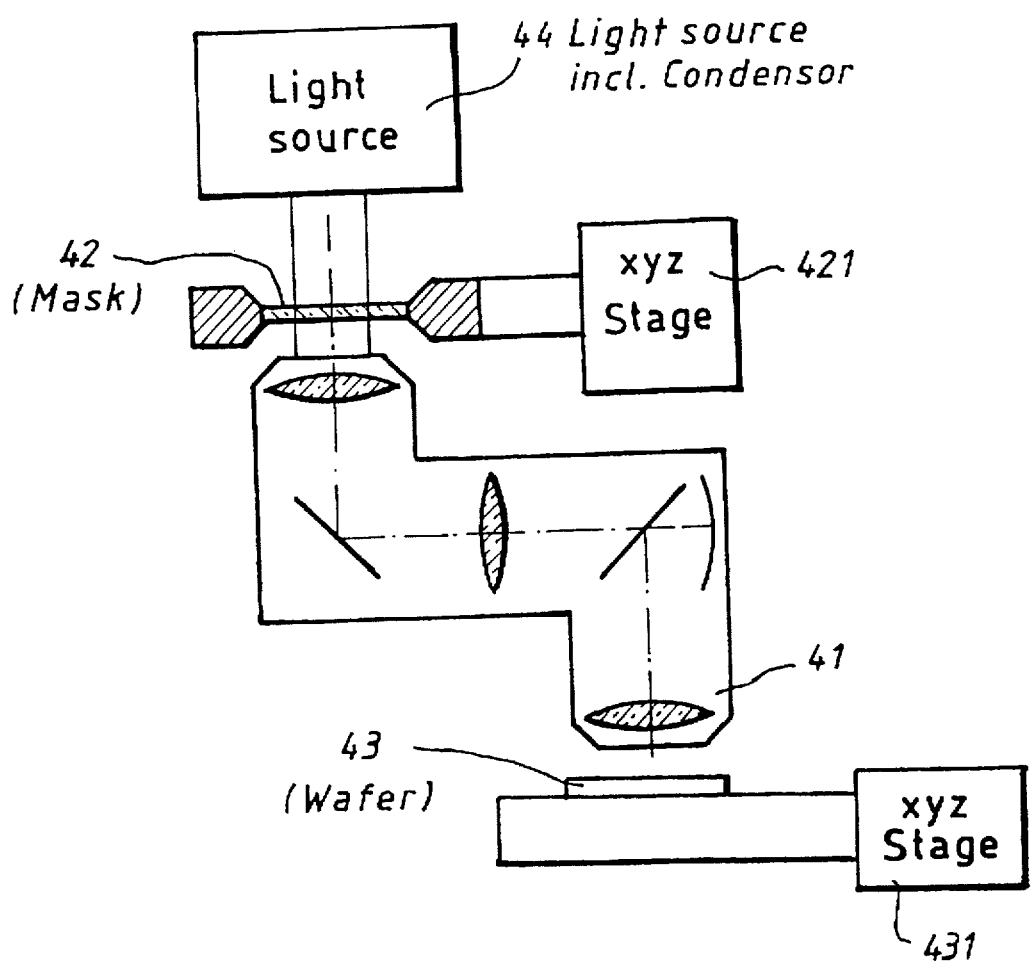
FIG. 2 is a schematic of a microlithographic projection apparatus.

FIG. 2 shows the integration of this catadioptric reduction objective 41 of FIG. 1a (the beam splitter cube is however replaced by a beam splitter plate) in a microlithographic projection apparatus known as a wafer stepper. A reticle 42 having a x-y-z positioning unit 421 is positioned in the object plane of the objective 41. The reticle 42 is illuminated with light of a suitable wavelength from a light source 44, for example, an excimer laser. A wafer 43 is mounted by means of a second x-y-z positioning unit 431 in the image plane of the objective 41.

A correction for the laser light for a wavelength in the UV-range or the DUV-range is provided.

Figure 3:
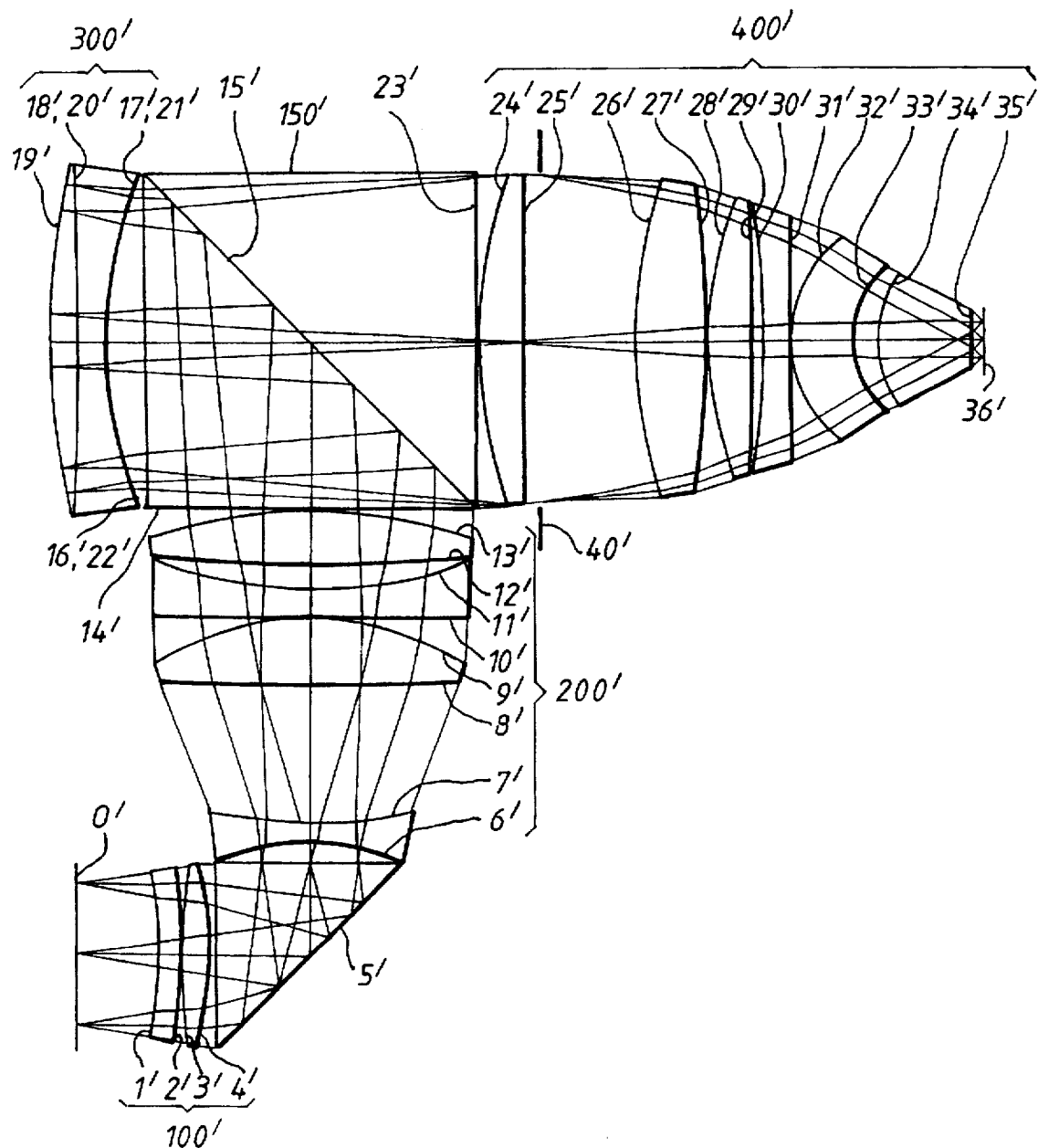
FIG. 3 is a lens section of a catadioptric reduction objective having a system diaphragm within the third lens group.

The embodiment shown in FIG. 3 as a lens section has the data in Table 2 and is very similar to the embodiment of FIG. 1a; however, the system diaphragm 40' is mounted within the third lens group 400' after the first lens (24', 25') thereof. The system diaphragm 40' is spaced 8 mm from the lens vertex of the surface 25'. The position of the system diaphragm 40' is fixed independently of the aperture in the range of half to the full stop number without affecting the image quality.

In this way, the system diaphragm 40' can remain fixed in position independently of the diaphragm aperture without higher telecentricity errors occurring because the convergent lens (24', 25') reduces the overcorrection of the Petzval sum and reduces the distance of the system diaphragm 40' to the main ray intersect point.

With the displacement device becoming unnecessary, the complexity for the assembly and operation of the objective is significantly reduced. The construction of the frame is further simplified because the system diaphragm 40' is displaced significantly away from the elements of the first lens group (100', 200').

With the above, and in contrast to the teaching of U.S. Pat. No. 5,289,312, the system diaphragm can be mounted not only in specific cases between the beam splitter surface and the third lens group but generally advantageous solutions with the system diaphragm between the beam splitter surface and the image plane can be achieved especially within the third lens group. In this way, very large numerical apertures having good correction can be obtained with a simple assembly.

The above-described examples have the imaging scale −0.25. Other imaging scales which are purposeful in microlithography are likewise realizable with the invention. Thus, an imaging scale in the range of −0.5 to −0.10 can be provided.

TABLE 1

| Wavelength $\lambda$ = 248.38 nm | | Numerical Aperture NA = 0.70 | |
|---|---|---|---|
| Imaging Scale $\beta$ = −0.25 | | Glass: Quartz n = 1.50834 | |
| Number | Radius | Thickness | Glass |
| 1 | −210.36 | 46.25 | |
| | | 13.36 | Quartz |
| 2 | −510.81 | | |
| | | 1.00 | |

TABLE 1-continued

| Wavelength $\lambda$ = 248.38 nm | | Numerical Aperture NA = 0.70 | |
|---|---|---|---|
| Imaging Scale $\beta$ = −0.25 | | Glass: Quartz n = 1.50834 | |
| Number | Radius | Thickness | Glass |
| 3 | 360.18 | | |
| | | 16.63 | Quartz |
| 4 | −174.55 | | |
| | | 55.17 | |
| 5 | Planar | | |
| | | 66.00 | |
| 6 | −133.61 | | |
| | | 9.70 | Quartz |
| 7 | 274.40 | | |
| | | 85.10 | |
| 8 | 2016.25 | | |
| | | 41.88 | Quartz |
| 9 | −173.29 | | |
| | | 1.04 | |
| 10 | Planar | | |
| | | 15.60 | Quartz |
| 11 | 251.70 | | |
| | | 14.80 | |
| 12 | 1004.4 | | |
| | | 28.71 | Quartz |
| 13 | −282.11 | | |
| | | 1.01 | |
| 14 | Planar | | |
| | | 95.50 | Quartz |
| 15 | Planar | | |
| | | 95.50 | Quartz |
| 16 | Planar | | |
| | | 18.47 | |
| 17 | −280.11 | | |
| | | 16.14 | Quartz |
| 18 | 1577.8 | | |
| | | 16.10 | |
| 19 | −455.9 | | Mirror |
| | | 16.10 | |
| 20 | −1578.0 | | |
| | | 16.14 | Quartz |
| 21 | 280.11 | | |
| | | 18.47 | |
| 22 | Planar | | |
| | | 191.0 | Quartz |
| 23 | Planar | | |
| | | 16.08 | |
| 24 | 269.14 | | |
| | | 26.98 | Quartz |
| 25 | 12084 | | |
| | | 44.08 | |
| 26 | 350.03 | | |
| | | 40.86 | Quartz |
| 27 | −596.96 | | |
| | | 1.01 | |
| 28 | 208.82 | | |
| | | 26.70 | Quartz |
| 29 | −2124.5 | | |
| | | 7.08 | |
| 30 | −436.19 | | |
| | | 24.52 | Quartz |
| 31 | 1966.2 | | |
| | | 1.01 | |
| 32 | 72.921 | | |
| | | 35.53 | Quartz |
| 33 | 51.743 | | |
| | | 9.02 | |
| 34 | 64.826 | | |
| | | 59.68 | Quartz |
| 35 | 2727.0 | | |
| | | 6.36 | |
| 36 | | | Image (Wafer) |

TABLE 2

| | | Wavelength λ = 248.38 nm | Numerical Aperture NA = 0.70 |
| | | Imaging Scale β = −0.25 | Glass: Quartz n = 1.50834 |

| Number | Radius | Thickness | Glass |
|---|---|---|---|
| 1 | −208.30 | 46.25 | |
| 2 | −498.48 | 11.38 | Quartz |
| 3 | 368.29 | 1.00 | |
| 4 | −173.64 | 16.30 | Quartz |
| 5 | Planar | 55.82 | |
| 6 | −127.78 | 66.00 | |
| 7 | 251.15 | 9.70 | Quartz |
| 8 | 1891.95 | 79.28 | |
| 9 | −160.51 | 38.73 | Quartz |
| 10 | −2818.18 | 1.03 | |
| 11 | 263.13 | 15.49 | Quartz |
| 12 | 997.93 | 13.96 | |
| 13 | −273.97 | 29.30 | Quartz |
| 14 | Planar | 1.00 | |
| 15 | Planar | 95.50 | Quartz |
| 16 | Planar | 95.50 | Quartz |
| 17 | −245.27 | 21.10 | |
| 18 | 3216.71 | 15.63 | Quartz |
| 19 | −437.42 | 15.16 | Mirror |
| 20 | −3216.71 | 15.16 | |
| 21 | 245.27 | 15.63 | Quartz |
| 22 | Planar | 21.10 | |
| 23 | Planar | 191.0 | Quartz |
| 24 | 278.04 | 1.00 | |
| 25 | 4615.58 | 24.57 | Quartz |
| 26 | 262.26 | 63.39 | |
| 27 | −620.91 | 40.81 | Quartz |
| 28 | 208.55 | 1.08 | |
| 29 | −2336.21 | 24.75 | Quartz |
| 30 | −441.28 | 6.67 | |
| 31 | 1144.28 | 15.29 | Quartz |
| 32 | 71.95 | 1.06 | |
| 33 | 50.36 | 36.07 | Quartz |
| 34 | 60.47 | 13.64 | |
| 35 | 3672.41 | 53.85 | Quartz |
| 36 | | 6.34 | Image (Wafer) |

I claim:

1. A catadioptric reduction objective for transmitting radiation from an object plane to an image plane defined by the objective, the catadioptric reduction objective defining an optical axis and comprising:

a first lens group for receiving the radiation from said object plane and transmitting the radiation along said optical axis toward said image plane;

a concave mirror;

a beam-splitter device mounted on said axis for deflecting said radiation toward said concave mirror;

a second lens group mounted between said concave mirror and said beam-splitter device for transmitting said radiation to said concave mirror and for transmitting the reflected radiation back toward said beam-splitter device and said image plane;

a third lens group having a plurality of lenses and being interposed between said image plane and said beam-splitter device for focussing said reflected radiation into said image plane; and, a system diaphragm mounted within said third lens group so as to be disposed between two lenses of said plurality of lenses.

2. The catadioptric reduction objective of claim 1, wherein the position of the system diaphragm is fixed independently of the aperture in the range of half to the full stop number without affecting the imaging quality.

3. The catadioptric reduction objective of claim 1, said system diaphragm defining a diaphragm plane disposed at an angle to said optical axis in the range of 80° to 100°.

4. The catadioptric reduction objective of claim 1, wherein a correction for laser light for a wavelength in the UV-range or the DUV-range is provided.

5. The catadioptric reduction objective of claim 1, said first lens group including a planar deflecting mirror mounted on said optical axis.

6. The catadioptric reduction objective of claim 1, wherein all lenses of each of said lens groups and said beam-splitter device are made of the same material.

7. The catadioptric reduction objective of claim 1, wherein all lenses of said first and second lens groups and said beam-splitter device are made of quartz and all convergent lenses of said third lens group are made of fluorite.

8. The catadioptric reduction objective of claim 1, wherein telecentricity is present between said object plane and said first lens group.

9. The catadioptric reduction objective of claim 1, wherein an imaging scale in the range of −0.5 to −0.10 is provided.

10. The catadioptric reduction objective of claim 1, wherein the distance from the beam-splitter device to said image plane is greater than 1.9 times the focal length of said third lens group.

11. The catadioptric reduction objective of claim 1, wherein the distance from said beam-splitter device to said object plane is less than the focal length of said first lens group.

12. A catadioptric reduction objective for transmitting radiation from an object plane to an image plane defined by the objective, the catadioptric reduction objective defining an optical axis and comprising:

a first lens group for receiving the radiation from said object plane and transmitting the radiation along said optical axis toward said image plane;

a concave mirror;

a beam-splitter device mounted on said axis for deflecting said radiation toward said concave mirror;

a second lens group mounted between said concave mirror and said beam-splitter device for transmitting said radiation to said concave mirror and for transmitting the reflected radiation back toward said beam-splitter device and said image plane;

a third lens group having a plurality of lenses and being interposed between said image plane and said beam-splitter device for focussing said reflected radiation into said image plane;

a system diaphragm mounted within said third lens group so as to be disposed between two lenses of said plurality of lenses; and, the beam-splitter device including a beam splitter defining a partially-transmitting mirror.

13. A catadioptric reduction objective for transmitting radiation from an object plane to an image plane defined by the objective, the catadioptric reduction objective defining an optical axis and comprising:

a first lens group for receiving the radiation from said object plane and transmitting the radiation along said optical axis toward said image plane;

a concave mirror;

a beam-splitter device mounted on said axis for deflecting said radiation toward said concave mirror;

a second lens group mounted between said concave mirror and said beam-splitter device for transmitting said radiation to said concave mirror and for transmitting the reflected radiation back toward said beam-splitter device and said image plane;

a third lens group having a plurality of lenses and being interposed between said image plane and said beam-splitter device for focussing said reflected radiation into said image plane;

a system diaphragm mounted within said third lens group so as to be disposed between two lenses of said plurality of lenses; and, the beam-splitter device including a plane-parallel plate having a partially-transmitting mirror formed thereon.

14. A catadioptric reduction objective for transmitting radiation from an object plane to an image plane defined by the objective, the catadioptric reduction objective defining an optical axis and comprising:

a first lens group for receiving the radiation from said object plane and transmitting the radiation along said optical axis toward said image plane;

a concave mirror;

a beam-splitter device mounted on said axis for deflecting said radiation toward said concave mirror;

a second lens group mounted between said concave mirror and said beam-splitter device for transmitting said radiation to said concave mirror and for transmitting the reflected radiation back toward said beam-splitter device and said image plane;

a third lens group having a plurality of lenses and being interposed between said image plane and said beam-splitter device for focussing said reflected radiation into said image plane;

a system diaphragm mounted within said third lens group so as to be disposed between two lenses of said plurality of lenses; and, said radiation including a main ray and a peripheral ray; and, the main ray angles and the peripheral ray angles being less than 10° to the optical axis in air at said beam-splitter device.

15. A catadioptric reduction objective for transmitting radiation from an object plane to an image plane defined by the objective, the catadioptric reduction objective defining an optical axis and comprising:

a first lens group for receiving the radiation from said object plane and transmitting the radiation along said optical axis toward said image plane;

a concave mirror;

a beam-splitter device mounted on said axis for deflecting said radiation toward said concave mirror;

a second lens group mounted between said concave mirror and said beam-splitter device for transmitting said radiation to said concave mirror and for transmitting the reflected radiation back toward said beam-splitter device and said image plane;

a third lens group having a plurality of lenses and being interposed between said image plane and said beam-splitter device for focussing said reflected radiation into said image plane;

a system diaphragm mounted within said third lens group so as to be disposed between two lenses of said plurality of lenses; and said beam-splitter device having a beam-splitter surface defining a polarization beam splitter and a $\lambda/4$-layer arranged between the polarization beam splitter and said concave mirror.

16. A catadioptric reduction objective for transmitting radiation from an object plane to an image plane defined by the objective, the catadioptric reduction objective defining an optical axis and comprising:

a first lens group for receiving the radiation from said object plane and transmitting the radiation along said optical axis toward said image plane;

a concave mirror;

a beam-splitter device mounted on said axis for deflecting said radiation toward said concave mirror;

a second lens group mounted between said concave mirror and said beam-splitter device for transmitting said radiation to said concave mirror and for transmitting the reflected radiation back toward said beam-splitter device and said image plane;

a third lens group having a plurality of lenses and being interposed between said image plane and said beam-splitter device for focussing said reflected radiation into said image plane;

a system diaphragm mounted within said third lens group so as to be disposed between two lenses of said plurality of lenses; and, the image side aperture being at least 0.60.

17. A microlithographic projection apparatus defining an optical axis, the apparatus comprising:

a catadioptric reduction objective including:

an object plane;

a first lens group;

a partially-transmitting mirror;

a second lens group;

a concave mirror;

a third lens group;

a system diaphragm between the partially-transmitting mirror and an image plane; and, wherein light coming from the object plane is transmitted by the first lens group, the partially-transmitting mirror and the second lens group to the concave mirror, where it is reflected and transmitted back through the second lens group, the partially-transmitting mirror, the third lens group and the system diaphragm to the image plane; and, providing a numerical aperture greater than 0.60 and image side telecentricity;

a first positioning unit for positioning a reticle in said object plane; and, a second positioning unit for positioning a wafer in said image plane.

18. A catadioptric reduction objective comprising:

an object plane;

a first lens group;

a beam-splitter device having a partially-transmitting mirror;

a second lens group;

a concave mirror;

a third lens group;

a system diaphragm between the partially-transmitting mirror and the image plane; and, wherein light coming from the object plane is transmitted by the first lens group, the partially-transmitting mirror and the second lens group to the concave mirror, where it is reflected and transmitted back through the second lens group, the partially-transmitting mirror, the third lens group and the system diaphragm to the image plane; and, providing a numerical aperture greater than 0.60 and image side telecentricity.

19. The catadioptric reduction objective of claim 18, said third lens group having a plurality of lenses including a first lens adjacent said beam-splitter device, and said system diaphragm being mounted behind said first lens of said third lens group as viewed from said beam-splitter device.

20. The catadioptric reduction objective of claim 19, wherein the position of the system diaphragm is fixed independently of the aperture in the range of half to the full stop number without affecting the imaging quality.

21. The catadioptric reduction objective of claim 18, wherein the beam-splitter device includes a plane-parallel plate having a partially-transmitting mirror formed thereon.

22. The catadioptric reduction objective of claim 18, said beam-splitter device having an exit surface facing toward said third lens group; and, said system diaphragm being mounted on said exit surface.

23. The catadioptric reduction objective of claim 18, said system diaphragm defining a diaphragm plane disposed at an angle to said optical axis in the range of 80° to 100°.

24. The catadioptric reduction objective of claim 18, wherein said radiation includes a main ray and a peripheral ray; and, the main ray angles and the peripheral ray angles are less than 10° to the optical axis in air at said beam-splitter device.

25. The catadioptric reduction objective of claim 18, said beam-splitter device having a beam-splitter surface defining a polarization beam splitter and a λ/4-layer arranged between the polarization beam splitter and said concave mirror.

26. The catadioptric reduction objective of claim 18, wherein a correction for laser light for a wavelength in the UV-range or the DUV-range is provided.

27. The catadioptric reduction objective of claim 18, said first lens group including a planar deflecting mirror mounted on said optical axis.

28. The catadioptric reduction objective of claim 18, wherein all lenses of each of said lens groups and said beam-splitter device are made of the same material.

29. The catadioptric reduction objective of claim 18, wherein all lenses of said first and second lens groups and said beam-splitter device are made of quartz and all convergent lenses of said third lens group are made of fluorite.

30. The catadioptric reduction objective of claim 18, wherein telecentricity is also present between said object plane and said first lens group.

31. The catadioptric reduction objective of claim 18, wherein an imaging scale in the range of −0.5 to −0.10 is provided.

32. The catadioptric reduction objective of claim 18, wherein the distance from the beam-splitter device to said image plane is greater than 1.9 times the focal length of said third lens group.

33. The catadioptric reduction objective of claim 18, wherein the distance from said beam-splitter device to said object plane is less than the focal length of said first lens group.

34. The catadioptric reduction objective of claim 18, said first group, said beam-splitter device and said concave mirror, all conjointly defining a light path; and, said beam-splitter device having a beam-splitter surface mounted in said light path for transmitting said radiation to said concave mirror.

35. A catadioptric reduction objective for transmitting radiation from an object plane to an image plane defined by the objective, the catadioptric reduction objective defining an optical axis and comprising:

a first lens group for receiving the radiation from said object plane and transmitting the radiation along said optical axis toward said image plane;

a concave mirror;

a beam-splitter device mounted on said axis for deflecting said radiation toward said concave mirror;

a second lens group mounted between said concave mirror and said beam-splitter device for transmitting said radiation to said concave mirror and for transmitting the reflected radiation back toward said beam-splitter device and said image plane;

a third lens group having a plurality of lenses and being interposed between said image plane and said beam-splitter device for focussing said reflected radiation into said image plane;

a system diaphragm mounted within said third lens group so as to be disposed between two lenses of said plurality of lenses;

said first group, said beam-splitter device and said concave mirror, all conjointly defining a light path; and, said beam-splitter device having a beam-splitter surface mounted in said light path for transmitting said radiation to said concave mirror.

* * * * *